(12) United States Patent
Audet et al.

(10) Patent No.: US 7,066,740 B2
(45) Date of Patent: Jun. 27, 2006

(54) AREA ARRAY PACKAGE WITH LOW INDUCTANCE CONNECTING DEVICE

(75) Inventors: Jean Audet, Cranby (CA); Luc Guerin, Cranby (CA); Jean-Luc Landreville, Cranby (CA); Gerald Pieree Audet, Cranby (CA)

(73) Assignee: International Business Machines Corporation, Armonk, NY (US)

( * ) Notice: Subject to any disclaimer, the term of this patent is extended or adjusted under 35 U.S.C. 154(b) by 377 days.

(21) Appl. No.: 10/604,555

(22) Filed: Jul. 30, 2003

(65) Prior Publication Data

US 2005/0013124 A1   Jan. 20, 2005

(30) Foreign Application Priority Data

Feb. 11, 2003   (CA) .................................. 2418683

(51) Int. Cl.
*H01R 12/00* (2006.01)
*H05K 1/00* (2006.01)

(52) U.S. Cl. .......................................... 439/66; 439/78
(58) Field of Classification Search ............... 439/66, 439/78

See application file for complete search history.

(56) References Cited

U.S. PATENT DOCUMENTS

| | | | |
|---|---|---|---|
| 4,686,492 A | 8/1987 | Grellmann et al. | 333/33 |
| 4,751,199 A | 6/1988 | Phy | 29/827 |
| 4,867,715 A | 9/1989 | Roth et al. | 439/876 |
| 4,987,474 A | 1/1991 | Yasuhara et al. | 257/666 |
| 5,270,492 A | 12/1993 | Fukui | 174/52.4 |
| 5,420,461 A | 5/1995 | Mallik et al. | 257/734 |
| 5,647,124 A | 7/1997 | Chan et al. | 29/840 |
| 6,007,349 A * | 12/1999 | Distefano et al. | 439/71 |
| 6,215,670 B1 | 4/2001 | Khandros | 361/774 |
| 6,302,702 B1 | 10/2001 | Audet et al. | 439/66 |
| 6,339,534 B1 | 1/2002 | Coico et al. | 361/760 |
| 6,532,651 B1 * | 3/2003 | Andou et al. | 29/852 |
| 6,590,772 B1 * | 7/2003 | Ju | 361/704 |
| 6,719,569 B1 * | 4/2004 | Ochiai | 439/66 |
| 2001/0015490 A1 | 8/2001 | Lee | 257/693 |

* cited by examiner

Primary Examiner—Hae Moon Hyeon
(74) Attorney, Agent, or Firm—Steve Capella

(57) ABSTRACT

An area-array integrated circuit package assembly are provided with a plurality of electrically conductive connectors attached to the package I.O. pads, that are used to connect the package to a printed circuit card or other component. The connectors comprise at least two parallel conductors flexing together in the same direction, electrically insulated from each other for a portion of their length between the package and printed circuit card to provide for reduced interconnection inductance. The connection with the component contact pads can be achieved by mechanically pressing the package and circuit card together or with the use of bonding material.

25 Claims, 10 Drawing Sheets

Prior Art

AREA ARRAY PACKAGE WITH LOW INDUCTANCE CONNECTING DEVICE

BACKGROUND OF INVENTION

In the mounting of an integrated circuit package to a printed circuit board, or similar support substrate, there are different methods of providing electrical interconnections between the package input/output (I/O) pads and the substrate pads. Different types of connecting devices can be used, according to the interconnection method and the configuration of the package.

One configuration that is commonly used in IC packages is to have the I/O pads positioned in an area array of contact pads on one surface of the package. The main advantage of the area array packages is the large number of I/O contacts that are provided, because essentially the entire bottom surface of the module or package is used, in comparison with peripheral lead products, which make use only of locations adjacent to the periphery of the package. Area array packages can have either fully or partly populated bottom surfaces with contact pads. These products are assembled to printed circuit boards using established soldering techniques, where one end of the connecting device is soldered to a contact on the package, and the other end to a contact on the printed circuit board.

In the field of area-array interconnections, solder balls and solder columns are the most common connecting devices that are used for soldering IC packages to the surface of the boards. In preparation for surface mounting on a printed circuit board for example, solder balls or solder columns are permanently attached to the IC package, which in turn are permanently attached to the printed circuit board pads by means of soldering. The assembled structure includes a connecting device, for example a solder ball, with two solder joints, one to a contact on the package surface and one to a contact on the printed circuit board surface.

One major restriction of the area array interconnection technology is the reliability of the solder joints. An assembled product is subjected to thermal variations, and significant stresses are transmitted to the solder joints because of the difference in thermal expansion between the printed circuit board and the IC package. This results from the differences in the coefficient of thermal expansion of the board and the package. One method to reduce stress in the solder joints is to increase the compliance or flexibility of the interconnection element. For example, instead of using a solder ball, a well-known solution is to use a solder column as the interconnecting element. Assembled solder ball connections provide short somewhat cylindrical interconnections, compared to solder columns which provide much longer cylindrical connections, typically in the order of three times longer. A longer cylindrical connection is more compliant resulting in lower stress being transmitted to the solder joints.

There are important drawbacks with the use of solder column interconnections. With a significantly longer connection element the inductance of the connection is increased. High inductance creates unwanted electrical noise in electrical packages. It is essential to maintain the inductance as low as possible in today's high speed or high frequency applications in order to optimize the electrical performance of the IC packages. It would be preferable to use connection elements that are more compliant than solder balls, but with a low inductance, equivalent to that resulting from use of solder balls.

Flat leads can be more compliant than cylindrical connections such as balls and columns. In the patent literature are descriptions of the possible use of flat leads in area array packages. U.S. Pat. No. 4,751,199 which issued Jun. 14, 1999 to Phy, entitled "Process of Forming a Compliant Lead Frame for Array-Type Semiconductor Packages", and U.S. Pat. No. 5,420,461 which issued May 30, 1995 to Mallik et al., entitled "Integrated Circuit Having a Two-Dimensional Lead Grid Array", teach the use of flat leads on an area array IC package. U.S. Pat. No. 6,339,534, issued Jan. 15, 2002 to Coico et al, entitled "Compliant Leads for Area Array Surface Mounted Components", shows another example of flat leads used in area-array packages. In this particular case, leads are arranged in a radially-oriented manner with respect to the center of the package, in order to reduce the stress transmitted to the package. Even with flat leads which are more flexible than cylindrical connections, it is preferable to have long leads to achieve stress reduction. The drawback with longer leads is the same as with solder columns, namely, electrical inductance is increased.

In the past, flat leads have been used extensively as interconnecting elements in peripherally connected products such as quad flat packs. In the field of peripheral interconnections, some examples show where duplicated leads are used as the interconnection elements. U.S. Pat. No. 4,867,715, issued Sep. 19, 1989 to Roth et al entitled "Interconnection Lead With Redundant Bonding Regions", U.S. Pat. No. 4,987,474 which issued Jan. 22, 1991 to Yasuhara et al, entitled "Semiconductor Device and Method of Manufacturing the Same", U.S. Pat. No. 5,270,492 which issued Dec. 14, 1993 to Fukui, entitled "Structure of Lead Terminal of Electronic Device", and U.S. Pat. No. 5,647,124 which issued Jul. 15, 1997 to Chan et al, entitled "Method of Attachment of a Semiconductor Slotted Lead to a Substrate" provide examples of the use of flat leads in peripheral connection packages. For today's high density IC packages, peripheral connection packages are not practical as they do not offer a sufficient number of I/O connections, because of the inherent configuration where only the outside peripheral area of the packages is used to connect to the printed circuit card.

Another method to connect an area array package to a printed circuit board is land-grid-array, or spring land-grid-array, that is described in U.S. Pat. No. 6,302,702, issued Oct. 16, 2001, to Audet et al, entitled "Connecting Devices and Method for Interconnections Circuit Components". This patent describes, connecting devices that are joined to the IC Package which are not soldered to contacts on the surface of the printed circuit boards. Alternatively, interconnections are achieved by compressing the tips of the connecting devices onto the pads of the printed circuit board, by use of compression hardware maintaining the IC package in position on the board. This allows the package to be demountably assembled to the printed-circuit board permitting removal and replacement of the package from the printed-circuit board without need to solder or de-solder the package. In this case, it is advantageous to have relatively long connecting springs, that are thereby more flexible. Longer springs also have some of the same drawbacks as described above, namely electrical inductance is increased if the spring connectors are longer. One configuration offering independent conductors is proposed in this prior art patent which comprises a pair of independently compressible spring arms. One drawback with this approach is the complexity and space required by the independently compressible spring arms.

As we mentioned earlier, the major drawback of increasing the length of the connecting devices is that, with increased length, inductance of the element is drastically increased. Impact of length on the inductance of a conductor is shown by the formula:

$$L_{self} = 5d\left\{\ln\left(\frac{2d}{r}\right) - \frac{3}{4}\right\} nH$$

for a cylindrical conductor of radius r and length d, where r and d are expressed in inches, and L in nano-Henry. (See reference: "Inductance", by Eric Bogatin, Giga Test Labs, Oct. 3, 2002)

From this formula, we see that if we have, for example, a conductor of 0.01 inches in diameter, increasing the length from 0.05 inches to 0.10 inches will increase the inductance by about three folds. This increase in inductance will have a negative impact on the switching noise of the IC package.

Many of the connecting devices shown in the prior art are a compromise between flexibility and inductance. If the connecting device is longer, it may be more flexible, but it will be more inductive.

One method of reducing inductance in IC device to package interconnections is to use more than one electrical conductor attached on each pad of the device, as well as on the package. This method is used in wire-bonded interconnections, as shown in U.S. Pat. No. 4,686,492, issued Aug. 11, 1987 to Grellman et al., entitled "Impedance Match Connection Using Multiple Layers of Bond Wires", U.S. Pat. No. 6,215,670, issued Apr. 10, 2001 to Khandros, entitled "Method for Manufacturing Raised Electrical Contact Pattern of Controlled Geometry", and U.S. patent application Ser. No. 2001/0015490, published Aug. 23, 2001 to Lee, entitled, "High Speed Digital and Microwave Device Package". All of these methods have the drawback of requiring the attachment of more than one wire bond on each of the pads of the IC device, and is not usable for area-array package interconnections.

Thus, as shown by this description of the prior art, it is apparent that there is a need for a flexible, but still low-inductance connecting device or connector for use in area-array packages, for use in surface-mounted soldered assemblies, as well as for land-grid-array, or demountable assemblies.

SUMMARY OF INVENTION

The present invention is directed to overcoming difficulties as exist in the prior art in attaching area-array packaging to substrate using known connectors. It is an object of the invention to provide assembles of integrated circuit packages and substrates and integrated circuit packages using connectors to result in products of high reliability and electrical performance, including reduced interconnection inductance.

According to one aspect of the invention there is provided an assembly of an integrated circuit package and substrate comprising a plurality of I/O pads located in an area-array configuration on a surface of the integrated circuit packages, a plurality of contact pads on a surface of said substrate and a plurality of electrically conductive connectors, each comprising a first contact surface, a second contact surface, and a flexible portion interconnecting said first and second contact surfaces of each connector. Each flexible portion is comprised of at least two parallel and flexible conductors, wherein said conductors are electrically insulated from each other for a portion of their lengths. The first contact surface of each of the connectors is joined to an I/O pad of the package; and the second contact surface of each of said connectors contacts a contact pad on the substrate, whereby each I/O pad on the surface of the integrated circuit package is electrically connected to a contact pad on the substrate by a connector.

According to another aspect of the invention, there is provided an integrated circuit package comprising a plurality of I/O pads located in an area-array configuration on a surface of the integrated circuit package and a plurality of electrically conductive connectors, each comprising a contact surface and a flexible portion connected to said contact surface. Each flexible portion is comprised of two parallel and flexible conductors, wherein the conductors are electrically insulated from each other for a portion of their lengths. The contact surface of each of the connectors is joined to an I/O pad on the surface of the package.

According to a further aspect of the invention, there is provided a connector for electrically interconnecting an I/O pad located in an area-array configuration of I/O pads on a surface of an integrated circuit package and one of a plurality of contact pads on a surface of a substrate. Each connector comprises a first contact surface, a second contact surface, and a flexible portion comprised of two parallel and flexible conductors, wherein the conductors are electrically insulated from each other for a portion of their lengths. The two parallel and flexible conductors are joined together at their extremities to form the first and second contact surfaces.

Further details and advantages of the aspects of the present invention will be apparent from the following description of the preferred embodiments of the invention, illustrated in the accompanying drawings.

DETAILED DESCRIPTION

Throughout this specification the term connecting device or connector is used to represent a lead, a spring, solder ball, solder column, or any other such element that can be used to interconnect contact pads on electronic components.

Figure 1:
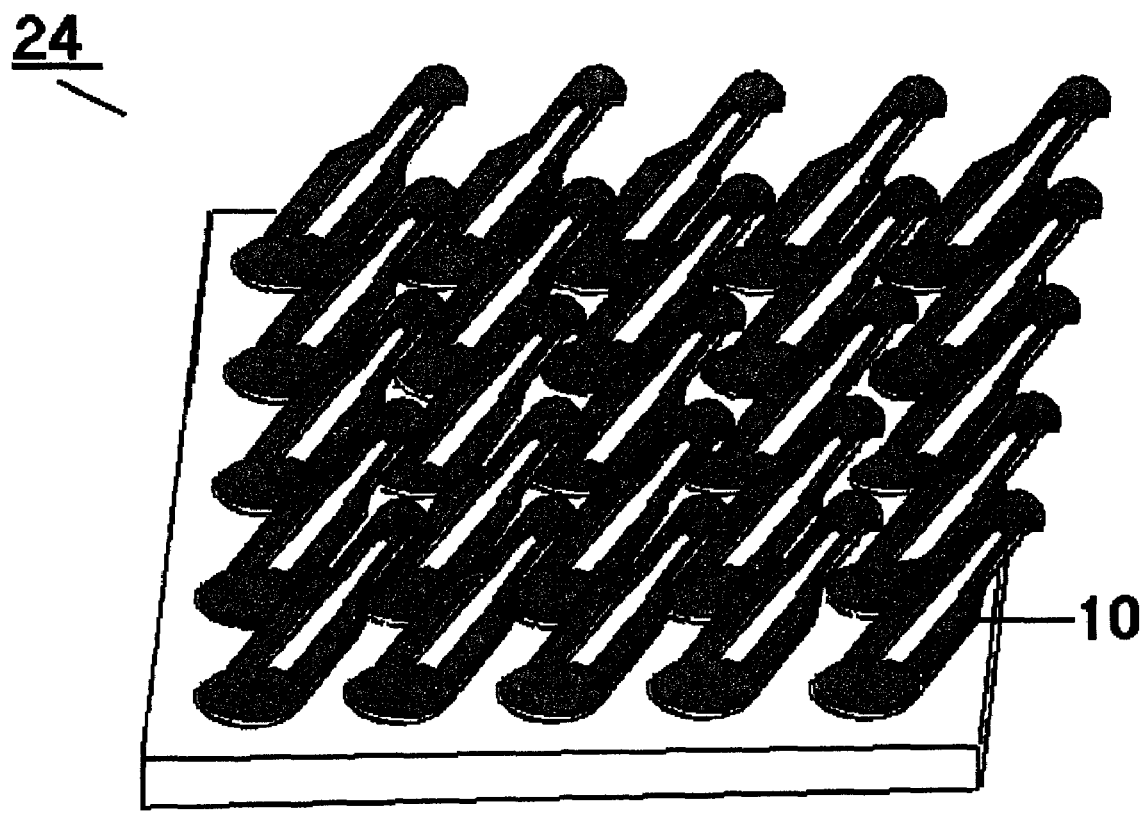
FIG. 1 is an isometric view of an IC package according to a preferred embodiment of the subject invention showing an array of connectors.

FIG. 1 is an isometric view of an IC Package (24) according to a first preferred embodiment of the subject invention. An array of connecting devices or connectors (10) is positioned in an area-array configuration on I.O. pads of a package (not shown in FIG. 1). For illustrative purposes, quantity of connecting devices as shown in the drawing is smaller than the quantity that is present in actual IC packages. IC packages can contain anywhere from 200 and 10,000 or more connectors depending upon the applications involved.

Figure 2:
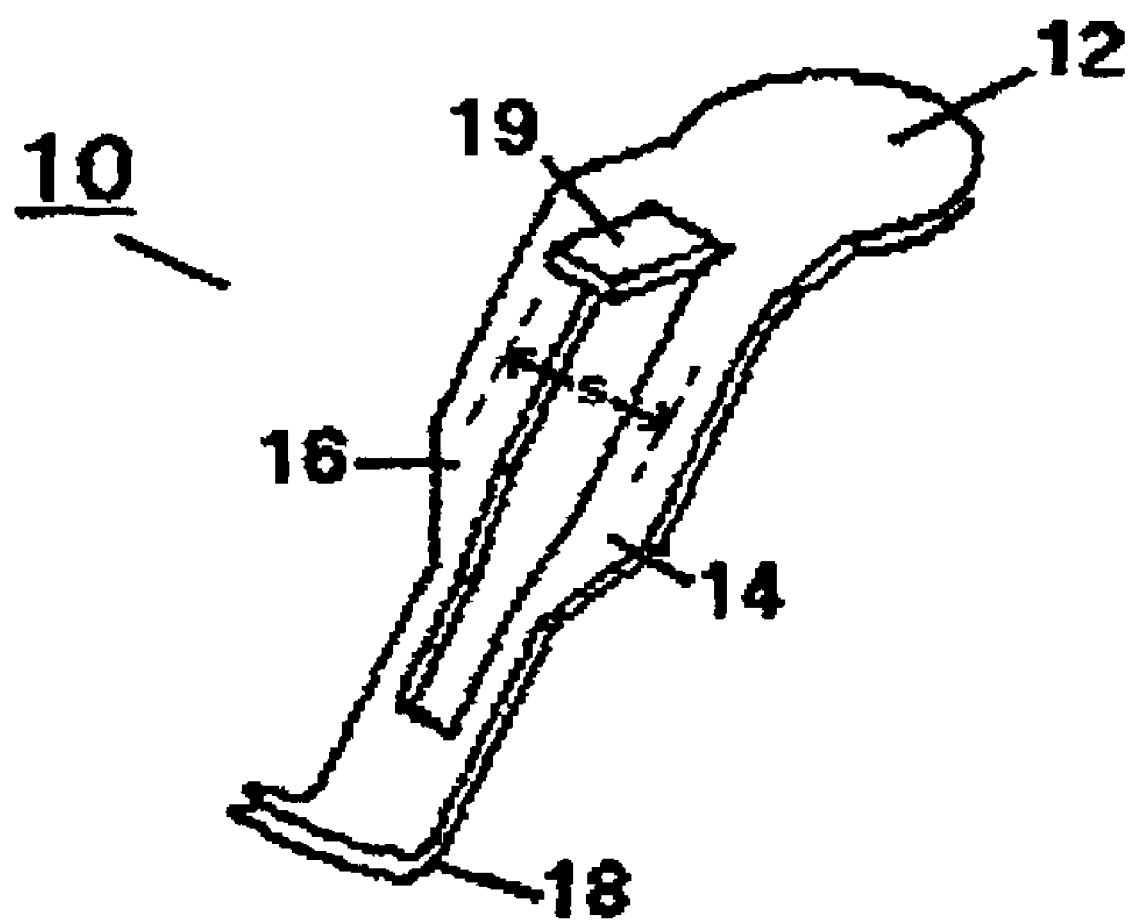
FIG. 2 is an isometric view of a single connector according to an aspect of the invention for use with a preferred embodiment of the invention.

FIG. 2 shows a preferred embodiment of a connector as part of the present invention, generally shown as (10). This connecting device is a compressable spring element, and is used to provide a demountable electrical conduction between an IC package and a printed circuit board. These two components are assembled together in a compressed assembly, similar to a land grid array interconnection. The term compressable spring element describes an element that is compliant, flexible, resilient and deforms which it is pressed against the contacts between an IC package and a circuit board.

Connector 10 comprises a first contact surface shown as flat pad (12), a flexible portion comprising two parallel flexible arms (14, 16), and a single spring tip or second contact surface (18). The surface portion of pad (12) provides an appropriate surface for soldering the connecting device onto an IC package I/O pad. Spring arms (14, 16) are compressed or flexed when the IC package is pressed down onto the printed circuit board. Spring arms exhibit elastic compliance or resilience and maintain contact force in order to provide appropriate contact of tip (18) with a pad on a printed circuit board. The tip (18) directly contacts a pad of a printed circuit board or substrate, without any use of bonding material.

The shape of connector (10) ensures reliable contact between contact pads on an IC package and printed circuit board (PCB). As shown in FIG. 2, the connecting device arms (14, 16) have a flat shape, positioned at an angle of approximately 45 degrees from the horizontal, which allows mechanical strain to be evenly distributed along the length of the spring arms which the connector is pressed as described, and thereby avoiding stress concentration zones that would exceed the elastic limit of the material of connector (10). Connector (10) also may include a tab portion (19) in addition to pad (12), which provides additional mechanical support of the solder joint between the connector (10) and the IC package.

Also, the appropriate shape of connector (10) provides, during compression assembly, a friction movement of the tip (18) on the surface of a PCB pad. This movement is called wiping effect and is useful in providing local cleaning of any contamination present on the PCB pad or on the connector device tip (18) thereby enhancing electrical contact.

Connector device (10) may be made of a material with suitable spring properties, for example Beryllium-copper, which is a well-known spring connector material used in the electronic industry. Beryllium-copper has a high elastic limit, that allows important elastic deformation when pressing forces are applied before any permanent deformation is induced into the material. Reliable electrical contact is obtained by use of appropriate surface finishes, for example, gold plating on the connector tips (18), and contact surfaces of pad (12) printed circuit board pads. One preferred way of fabricating the connecting device (10) is to stamp the appropriately shaped connectors from a flat metal sheet, and then fold the connectors into an appropriate form as may be shown in FIG. 2.

Figure 3:
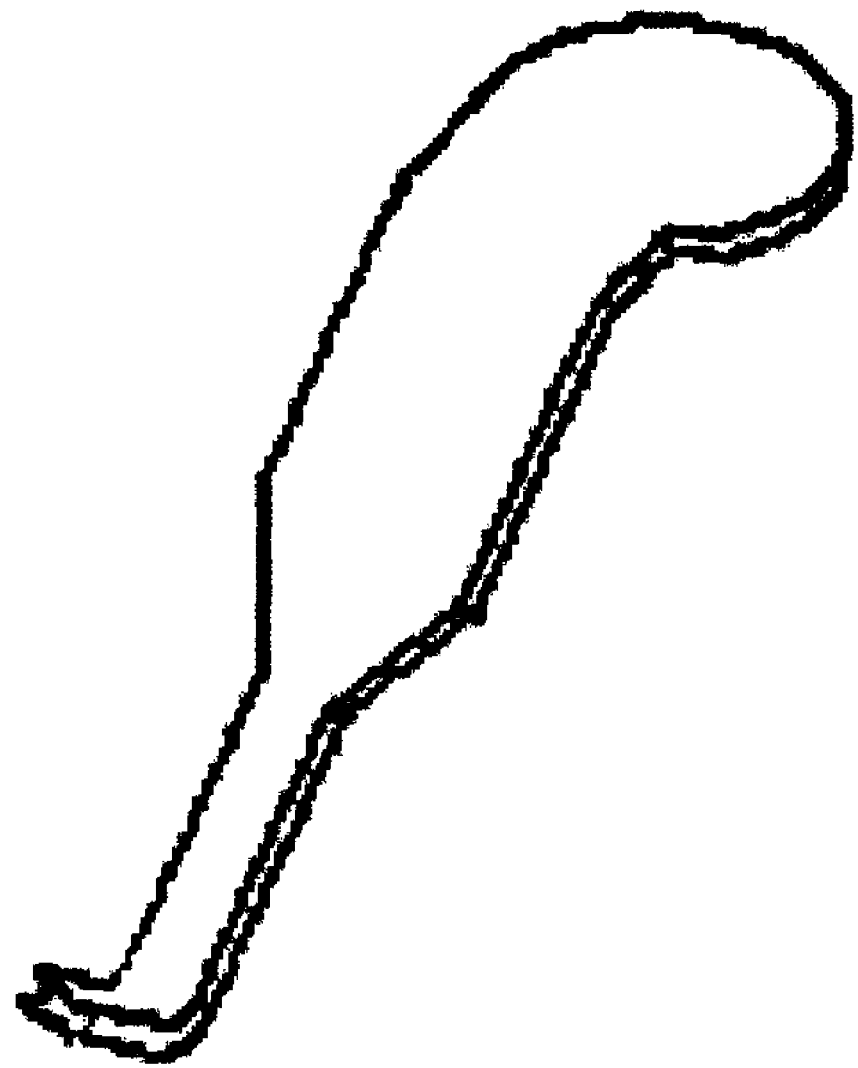
FIG. 3 is an isometric view of a connecting device as known from the prior art.

FIG. 3 shows a connecting device known from the prior art. In comparison, the inventive connector (10) of FIG. 2, may have similar length and thickness. The total width of the two parallel arms of the connector (10) of FIG. 2 may be similar to the width of the single arm of the prior art connecting device. Consequently, these two devices have similar flexibility; consequently the force that is required to flex these connecting devices is similar.

One advantage of the inventive connector (10) of FIG. 2 over the prior art device of FIG. 3 is the reduced inductance obtained by separating the flexible arm into two parallel conductors.

When a single conductor having inductance L1 is replaced by a pair of identical smaller, parallel conductors of the same length having inductance L2, the inductance is reduced, per the following formula:

$$L1 = 5d\left\{\ln\left(\frac{2d}{r1}\right) - \frac{3}{4}\right\}nH$$

$$L2 = L2/2 + L \text{ (mutual)}$$

where $$L_{mutual} = 5d\left\{\ln\left(\frac{2d}{s}\right) - 1 + \frac{s}{d} - \left(\frac{s}{2d}\right)^2\right\}nH$$

where s is the distance between centers of each of the two parallel conductors. (See reference: "Inductance" by Eric Bogatin, Giga Test Labs, Oct. 3, 2002).

As seen from the formula above, duplicating the conductors theoretically reduces the total inductance "L2" in half, but because the distance between the two parallel conductors is not infinite, there is a mutual inductance "Lmutual" between the two conductors, that makes the total inductance "L2" higher than half of that of the single conductor "L1". As shown from the formula, it is advantageous to maintain the distance between the conductors "s" to a maximum, in order to minimize the detrimental effect of the mutual inductance. In general, it is recommended to have the distance "s" to be at least 10 percent of the length of the conductors.

As a result, it has been determined that reduced inductance of connector (10) of FIG. 2 has a self-inductance of 480 pico-henry, compared to 580 pico-henry for the prior art device of FIG. 3. In a typical design, distance "s" between the centers of the two parallel arms (14) and (16) of connector of FIG. 2 is approximately 0.015 inches, and the length of the parallel arms (16, 14) is 0.045 inches.

It is apparent that the above description and formula that increasing the number of conductors in the flexible portion of the connector (10) to more than 2 would result in a connector of even further reduced inductance.

Figure 4:
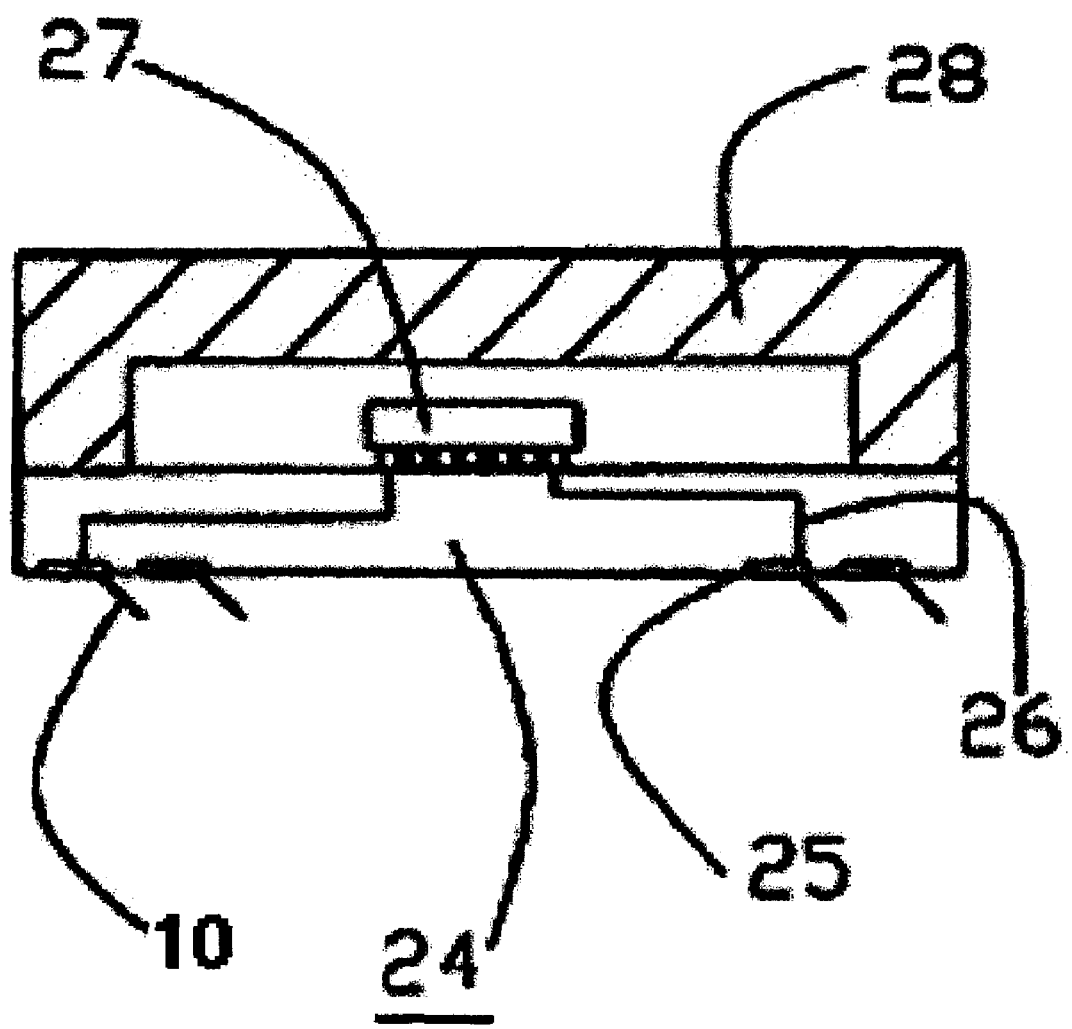
FIG. 4 is a side view showing an IC package according to a preferred embodiment of the subject invention.

FIG. 4 shows a side view of the IC package (24) with compressable connector (10) attached to the package I/O pads (25) of package (24) as known. IC package (24) provides electrical pathways (26) between the integrated circuit device (27) and the package I/O pads (25). Connectors (10), each comprising at least two parallel flexible arms (not visible in FIG. 4) are soldered to each of the package I/O pads (25), and provide for interconnection of pad (25) on package (24) to a printed circuit board. Lid (28) may be optionally attached on top of the package, and is used for sealing and shielding the chip or integrated circuit device (27), as is well known.

Figure 5:
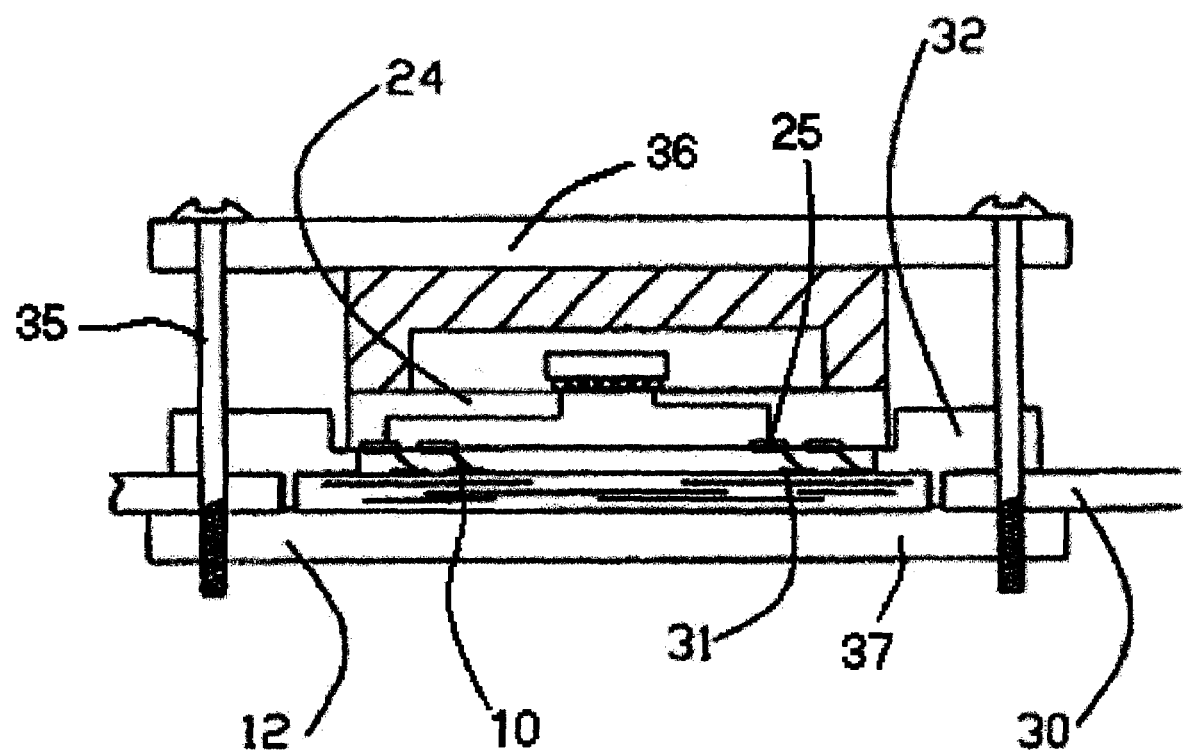
FIG. 5 is a side view showing the IC package of a preferred embodiment of the present invention shown in FIG. 4, after it is assembled on a printed circuit card.

FIG. 5 shows a side view of an IC package (24) assembled on an appropriate substrate (30), for example, a printed circuit board. IC package (24), with connectors (10) pre-attached to I/O pads (25), is assembled onto printed circuit board (30) with connecting devices (10) in compression or flexed. Each connector (10) will be compressed or flexed onto an individual printed circuit board pad (31), and thus provide electrical connection from the IC package (24) to the printed circuit board (30) when IC package (24) and circuit board (30) are pressed together. Appropriate hardware mechanism may be used to apply suitable compression force to the package (24) in order to flex the connectors (10). Such compression hardware may include retaining screws (35), top plate (36), and bottom plate (37). During compression assembly, retaining screws (35) are fastened into the bottom plate (37), creating compressive force on the array of connector (10) as previously described. Such hardware mechanisms are known.

Alignment frame (32) provides accurate horizontal positioning of package (24) and connectors (10) with respect to corresponding printed circuit board pads (31). In this embodiment, package I/O pads (25) are positioned to a specific horizontal offset relatively to the printed circuit board pads (31) as is apparent in order to effectively accommodate the shape of connectors (10) and result in electrical connections.

Figure 6:
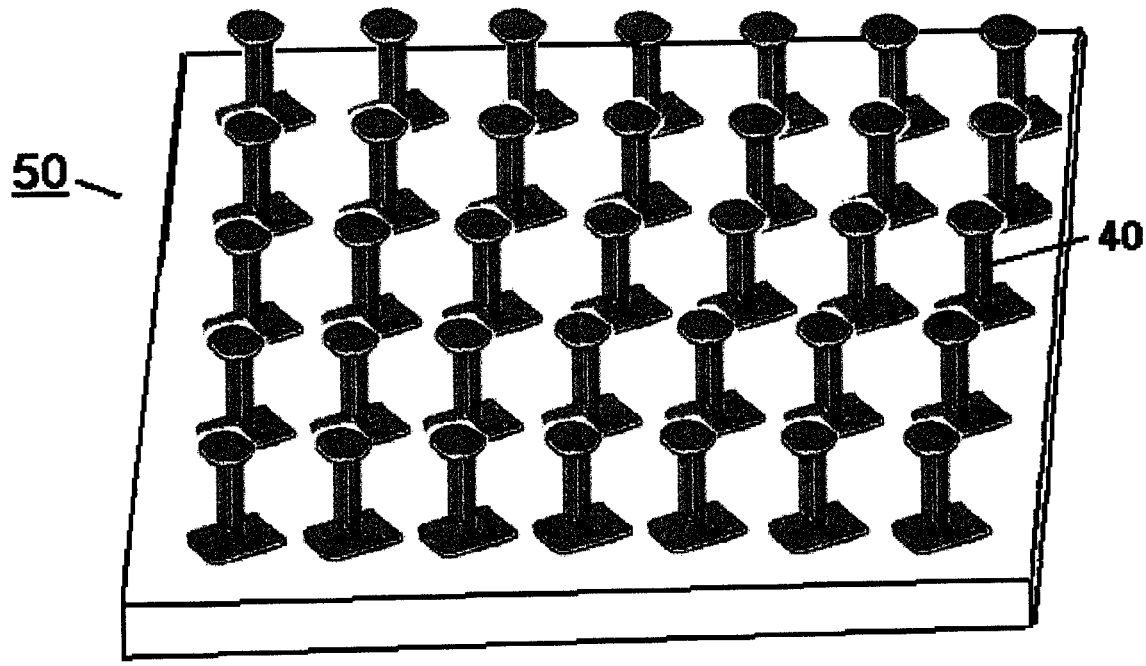
FIG. 6 is an isometric view of an IC package according to another preferred embodiment of the present invention.

FIG. 6 shows another preferred embodiment of an IC package (50) of the present invention. The isometric view of FIG. 6 shows an array of connectors (40) positioned in an area-array configuration on the I/O pads (not shown) of package (50). Package (50) may be similar to the IC package (24) of FIG. 5.

Figure 7:
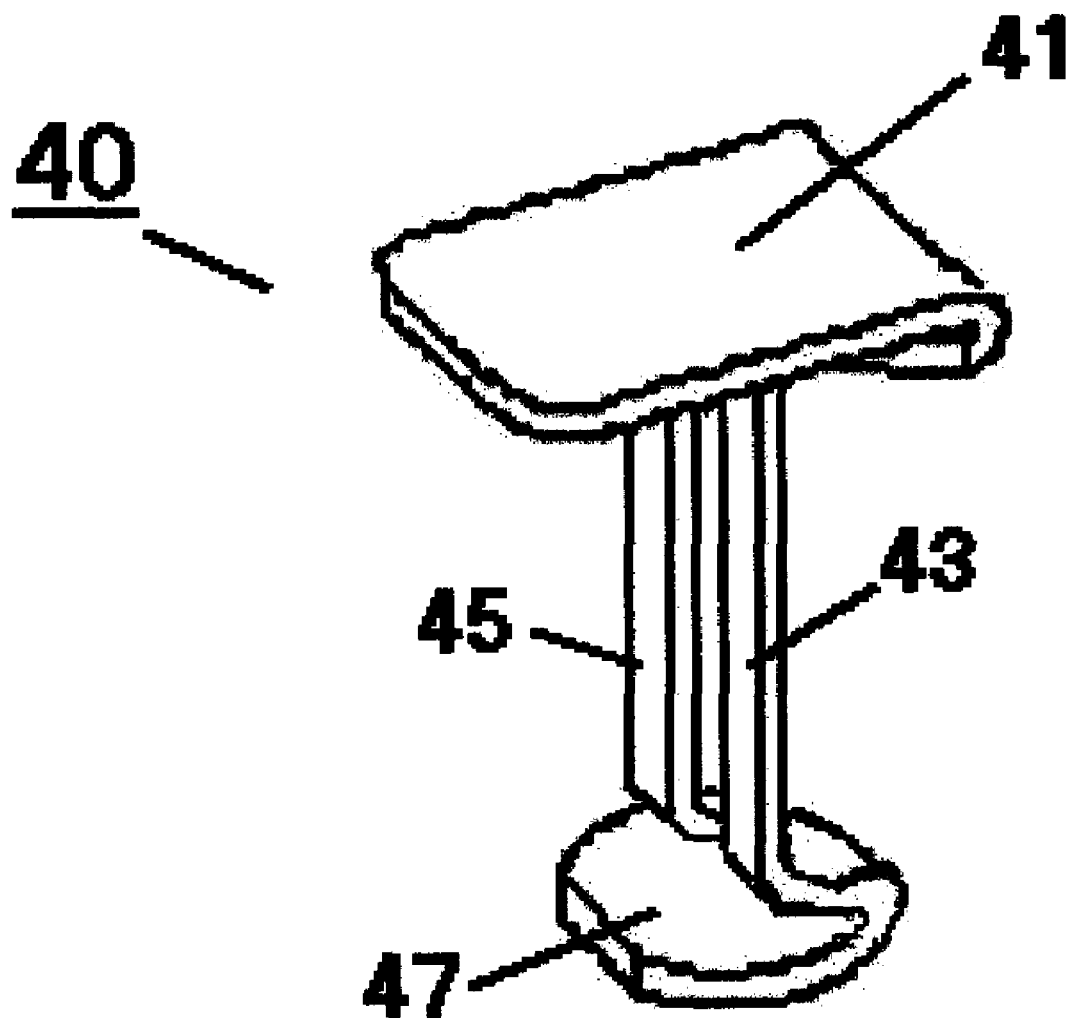
FIG. 7 is an isometric view of a single connector according to another aspect of the invention for use with the preferred embodiment shown in FIG. 6.

FIG. 7 shows a connector to be used with a preferred embodiment of the present invention of FIG. 6, generally shown as (40). In this case, contrary to the previously described embodiment of the connecting device, the second or lower contact surface of the connector (40) is adapted to be joined to pads of the printed circuit board by means of soldering in order to provide electrical connection between two components, for example between an IC package and a printed circuit board.

Illustrated connector (40) comprises a flat pad or contact surface (41), a flexible portion comprised of two parallel flexible arms (43, 45), and a second flat pad or contact surface (47). The second contact surface (47) provides an appropriate surface for soldering the connector (40) onto an IC package I/O pad. Flexible portion consisting of arms (43, 45) are connected to the flat surfaces (41) and (47) by means a U-shape bend in the material of connecting device (40). Appropriate choice of material makes the two parallel flexible arms to be compliant to absorb deformations resulting from thermal expansion differential between the interconnected IC package and printed circuit board. As noted from the previous description, the two parallel flexible conductors (43) and (45) could be replaced with a plurality of parallel conductors, each of similar shape and size.

One preferred way of fabricating the connector (40) is to stamp the appropriate shape from a flat metal sheet, and then fold it into an appropriate form as is shown in FIG. 7. Appropriate surface finishes can be applied to the connecting elements (41) and (47) using standard plating or inlay cladding methods. Connectors (40) may be more of beryllium-copper based metal, as described for the previous connector embodiment with a coating of tin or other suitable metal to assure solderability.

Figure 8:
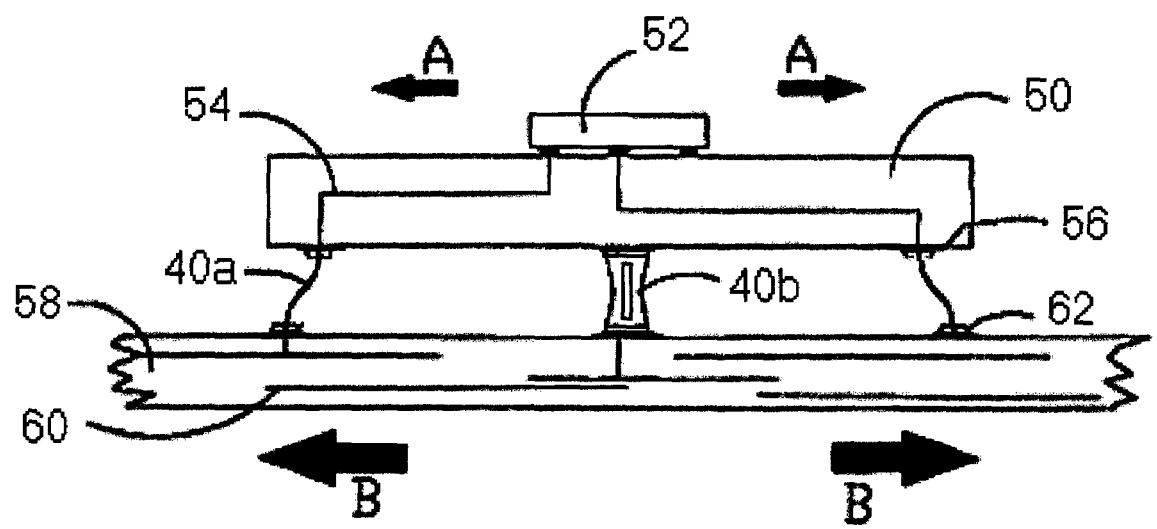
FIG. 8 is a side view showing the IC package of the preferred embodiment of the present invention shown in FIG. 6, after it is assembled on a printed circuit card.

FIG. 8 is a side cross-sectional view showing an IC package according aspects of the present invention assembled on a printed circuit card by surface mount methods. IC package (50) comprises an integrated circuit chip (52), internal conductive wiring (54) interconnecting chip (52) to a plurality of I/O pads (56). IC package (50) is joined to a substrate, such as printed circuit card (58) which comprises conductive wiring (60), and a plurality of contact pads (62). Each connection of package (50) to card (58) comprises a connector (40a or 40b), each with at least two parallel flexible arms, as previously described and shown in FIG. 7, and a pair of solder joints, joining the IC package I/O pad (56) and the card pad (62) to the connector. For illustrative purposes, only a few connectors (40) are shown in FIG. 8. An actual product would contain usually a complete array of connectors (40). Arrows A represent schematically the amount and direction of thermal stress to which the IC package (50) is subjected due to operating temperatures. Arrows B represent the amount of thermal stress to which the printed circuit card (58) is subjected due to operating temperatures. Arrows B are larger than arrows A, indicating that in this example, circuit card (58) has a higher amount of thermal expansion than the package (50), thereby causing deformation of connectors (40).

Figure 9:
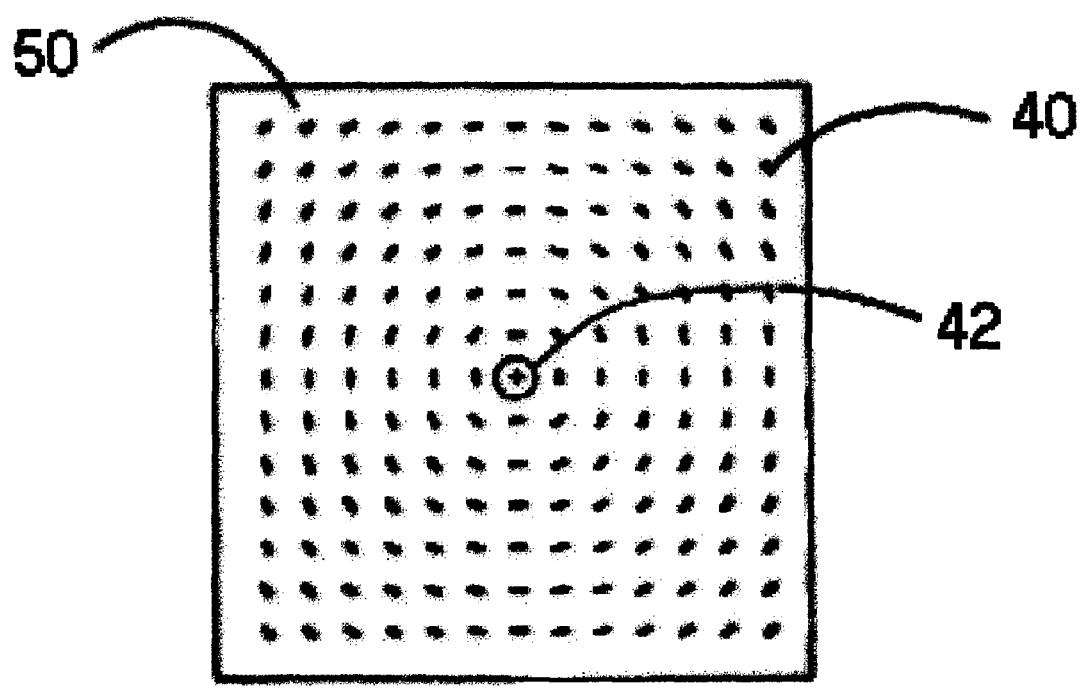
FIG. 9 is a top view of an IC package showing a preferred way to orient and position connectors for use in the preferred embodiment of the present invention shown in FIG. 6.

FIG. 9 shows how the connectors (40) could be preferably positioned on the IC package. Illustrates a top view of an IC package (50) representative of the present invention, showing the orientation of the flat parallel arms or conductors of the connector (40). As shown, connectors (40) are positioned on and attached to contacts on the IC package (50). Flat arms or conductors of the connectors (40) are facing the geometric center of the package. Geometric center of the package corresponds to zero-stress, or neutral stress point (42) of the product at operating temperatures. With this orientation, the flat arms of connectors (40) are oriented in a perpendicular orientation with respect to the forces resulting from the thermal deformations.

Figure 10:
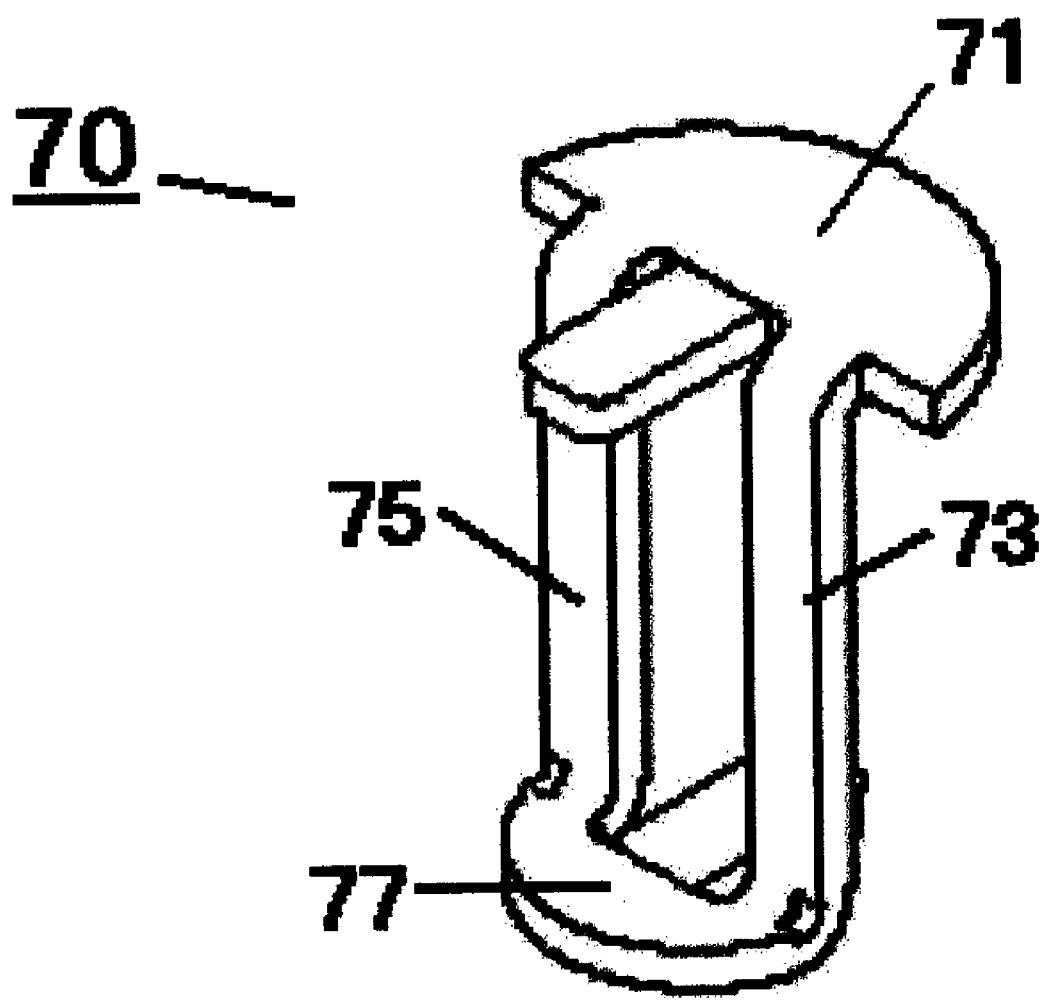
FIG. 10 is an isometric view of an alternative design and shape of a connector to that shown in FIG. 7 for use with the second preferred embodiment shown in FIG. 6.

FIG. 10 shows an alternative shape and design of a connector to be used with the preferred embodiment of the invention previously described and shown with respect in FIGS. 6 to 9 similar as the previously described connector (40). This connector (70) comprises a flat pad (71) or contact surface, a flexible portion comprised of two parallel flexible arms (73, 75), and a second fiat pad (77) or contact surface. Only two parallel conductor arms illustrated but connector (70) could have more than two arms as is apparent. Second flat pad or contact surface (77) provides an appropriate surface for soldering the connector (70) onto an IC package I/O pad. As can be seen from FIG. 10, both top and bottom flat pad contact surfaces (71, 77) comprise a semi-circular portion and a tab portion, obtained by cutting and bending the appropriate shape from a flat metal sheet, and then folding it into an appropriate form to thereby provide for greater surface area for soldering resulting in solder connections of greater strength.

The above figures of the drawings and accompanying description are provided for illustrative purposes only of preferred embodiments of the invention. The invention is not intended to be limited to the exact shape or design, number of pads, connectors or the nature of materials shown or described. It will be appreciated to those of ordinary skill in the art that the present invention can be embodied in other specific forms without departing from the spirit or scope of the present invention.

The invention claimed is:

1. An assembly of an integrated circuit package and a substrate comprising;
   a plurality of input/output (I/O) pads located in an area-array configuration on a surface of the integrated circuit package;
   a plurality of contact pads on a surface of said substrate;
   a plurality of electrically conductive connectors, each comprising a first contact surface, a second contact surface, and a flexible portion interconnecting said first and second contact surfaces;

each said flexible portion is comprised of at least two parallel and flexible conductors flexed in the same direction, wherein said conductors are electrically insulated from each other for a portion of their lengths;

the first contact surface of each of said connectors is joined to an I/O pad of the package; and the second contact surface of each of said connectors contacts a contact pad on said substrate;

whereby each I/O pad on the surface of the integrated circuit package is electrically connected to a contact pad on the substrate by a connector.

2. The assembly according to claim 1, wherein the second contact surface of each connector is pressed against a contact pad of said substrate to thereby provide a demountable electrical connection between said contact pad of said substrate and said second contact surface.

3. The assembly according to claim 2, wherein said flexible portion of each connector projects at an angle from the first contact surface of the connector and is flexed in a direction generally toward the surface of the integrated circuit package.

4. The assembly according to claim 1 wherein the second contact surface of the connector is joined to a contact pad on the substrate by bonding material.

5. The assembly according to claim 4, wherein the bonding material is solder.

6. The assembly according to claim 3 wherein connectors are arranged and oriented on the surface of the integrated circuit package around the geometric center of the package such that flexing of the parallel conductors of each connector is in a direction towards the geometric center of the package.

7. The assembly according to claim 6, wherein the distance between the at least two parallel conductors corresponds to at least 10 percent of the length of the portion of the length of the conductors which are insulated from each other.

8. The assembly according to claim 7, wherein each connector further comprises a tab portion extending from the first contact surface and said tab portion is generally coplanar with the first contact surface.

9. The assembly according to claim 8, wherein each connector is made of flat, metallic, electrically conductive material, folded to form the first and second contact surfaces and the contact surfaces are coated with a different metal.

10. The assembly according to claim 9, wherein the flexible portion is substantially perpendicular to the first contact surface and the second contact surface is generally parallel to the first contact surface.

11. The assembly according to claim 10, wherein each said at least two parallel and flexible conductors of a connector have extremities that are joined together to form the first and second contact surfaces.

12. An integrated circuit package comprising:
a plurality of input/output (I/O) pads located in an area-array configuration on a surface of the integrated circuit package;
a plurality of electrically conductive connectors, each comprising a first contact surface, a second contact surface, and a flexible portion interconnecting said first and second contact surfaces;
each said flexible portion is comprised of at least two parallel and flexible conductors flexed in the same direction, wherein said conductors are electrically insulated from each other for a portion of their lengths;

the first contact surface of each of said connectors is joined to an I/O pad on the surface of the package, and said second contact surface of each of said connectors is available for connection to a substrate.

13. The integrated circuit package according to claim 12, wherein the distance between the at least two conductors corresponds to at least 10 percent of the length of the portion of the length of the conductors which are insulated from each other.

14. The integrated circuit package according to claim 13, wherein each connector further comprises a tab portion extending from the contact surface and said tab portion is generally coplanar with the contact surface.

15. The integrated circuit package according to claim 14, wherein each connector is made of flat, metallic, electrically conductive material, folded to form the contact surface and the contact surface is coated with a different metal.

16. The integrated circuit package according to claim 15, wherein the flexible portion is substantially perpendicular to the contact surface.

17. The integrated circuit package according to claim 16, wherein each said flexible portion is comprised of two parallel and flexible conductors.

18. A connector for electrically interconnecting an input/output (I/O) pad located in an area-array configuration of I/O pads on a surface of an integrated circuit package and one of a plurality of contact pads on a surface of a substrate, said connector comprising;
a first contact surface;
a second contact surface;
a flexible portion is comprised of at least two parallel and flexible conductors wherein each of said conductors can be flexed in the same direction at the same time, wherein said conductors are electrically insulated from each other for a portion of their lengths; and wherein said at least two parallel and flexible conductors are joined together at their extremities to form said first and second contact surfaces at opposite extremities.

19. The connector according to claim 18, wherein the distance between the at least two conductors corresponds to at least 10 percent of the length of the portion of the length of the conductors where the conductors are insulated from each other.

20. The connector according to claim 18, wherein said connector further comprises a tab portion extending from the first contact surface and said tab portion is generally coplanar with the first contact surface.

21. The connector according to claim 20, wherein the connector is made of flat, metallic, electrically conductive material, folded to form the contact surfaces and the contact surfaces are coated with a different metal.

22. The connector according to claim 21, wherein the flexible portion is substantially perpendicular to the first contact surface and the second contact surface is generally parallel to the first contact surface.

23. The connector according to claim 22, wherein each said flexible portion is comprised of two parallel and flexible conductors.

24. The assembly of claim 1 wherein each connector contains only two parallel flexible conductors.

25. The assembly of claim 1 wherein said flexible conductors of a connector are substantially coplanar.

* * * * *